United States Patent
Tamdem et al.

(10) Patent No.: US 10,908,665 B2
(45) Date of Patent: Feb. 2, 2021

(54) MAINTAINING PROPER VOLTAGE SEQUENCE DURING SUDDEN POWER LOSS

(71) Applicant: Intel Corporation, Santa Clara, CA (US)

(72) Inventors: Horthense D. Tamdem, Portland, OR (US); Pavan Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 16/225,047

(22) Filed: Dec. 19, 2018

(65) Prior Publication Data

US 2019/0129487 A1   May 2, 2019

(51) Int. Cl.
| | | |
|---|---|---|
| *G06F 1/30* | (2006.01) | |
| *G06F 1/28* | (2006.01) | |
| *G05F 1/569* | (2006.01) | |
| *G01R 19/165* | (2006.01) | |
| *G06F 1/26* | (2006.01) | |
| *H02J 1/14* | (2006.01) | |

(52) U.S. Cl.
CPC ......... *G06F 1/30* (2013.01); *G01R 19/16552* (2013.01); *G05F 1/569* (2013.01); *G06F 1/26* (2013.01); *G06F 1/28* (2013.01); *H02J 1/14* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| | | |
|---|---|---|
| 2007/0247124 A1 | 10/2007 | Mihashi |
| 2015/0001933 A1 | 1/2015 | Uan-Zo-Li et al. |
| 2015/0192943 A1 | 7/2015 | Roham et al. |
| 2016/0181803 A1* | 6/2016 | Krishnamurthy ....... G06F 1/263 307/31 |
| 2017/0177057 A1 | 6/2017 | Morning-Smith et al. |

(Continued)

FOREIGN PATENT DOCUMENTS

JP    2007288974 A    11/2007

OTHER PUBLICATIONS

PCT Mar. 24, 2020 International Search Report and Written Opinion from International Application No. PCT/US2019/062160; 11 pages.

*Primary Examiner* — Zahid Choudhury
(74) *Attorney, Agent, or Firm* — Patent Capital Group

(57) ABSTRACT

Various embodiments comprise a protective circuit to connect at least two voltage rails to each other upon detection of the loss of the supply voltage that provides input power to the voltage regulators. The protective circuit may cause the two outputs of the voltage regulators to be connected to each other through a resistor when such a loss occurs. This in turn may prevent possible circuit damage in the load by preventing the higher output voltage from dropping below the lower output voltage if the capacitors on the outputs of the voltage regulators discharge at different rates. Such a reverse-voltage condition might otherwise cause damage in the load circuitry.

20 Claims, 5 Drawing Sheets

(56) References Cited

U.S. PATENT DOCUMENTS

2017/0255214 A1    9/2017  Ho et al.
2018/0302077 A1*  10/2018  Navarro Castillo ..... H03K 7/08
2018/0341306 A1*  11/2018  Jahagirdar ............ G06F 9/5094
2019/0129487 A1    5/2019  Tamdem et al.

* cited by examiner

MAINTAINING PROPER VOLTAGE SEQUENCE DURING SUDDEN POWER LOSS

TECHNICAL FIELD OF THE INVENTION

Various embodiments of the invention relate to controlling power to digital integrated circuits with an intention of avoiding damage to the integrated circuits as a result of a sudden loss of the source power.

BACKGROUND

Most compute platforms are powered by multiple voltage rails that are properly sequenced during startup and shutdown by programmable devices such as field programmable gate arrays (FPGAs). Under normal circumstances these devices ensure that various voltage regulators (VRs) on the platform are turned on/off in correct sequence to prevent incorrect voltage relationships from damaging sensitive loads such as processors, memories, etc.

However, such a safeguard may fail to protect when there is a sudden loss of the platform power source that powers the VRs. This event may also remove power from the FPGA or other circuitry that controls the shutdown. The rate of voltage ramp down of each rail may then depend on the size of the storage capacitor at the output of that VR and the load being placed on that rail. For example, if this occurrence caused the 12 volt rail to drop lower than the 5 volt rail, even briefly, this might result in a damaging reverse voltage potential across parts of the circuitry.

BRIEF DESCRIPTION OF THE DRAWINGS

Some embodiments of the invention may be better understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Figure 1B:
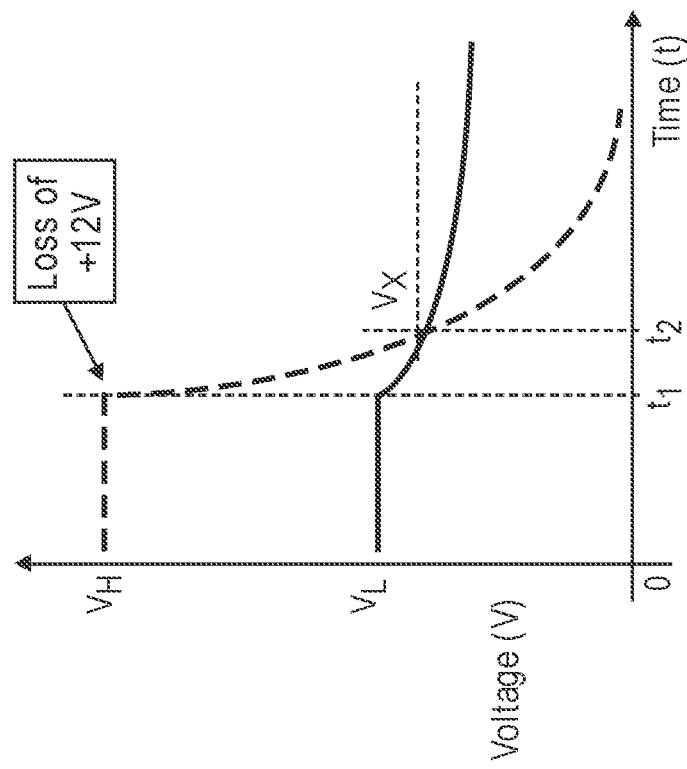
FIG. 1B shows a diagram of voltage rails after a loss of source power to the circuit of FIG. 1A.
Figure 1A:
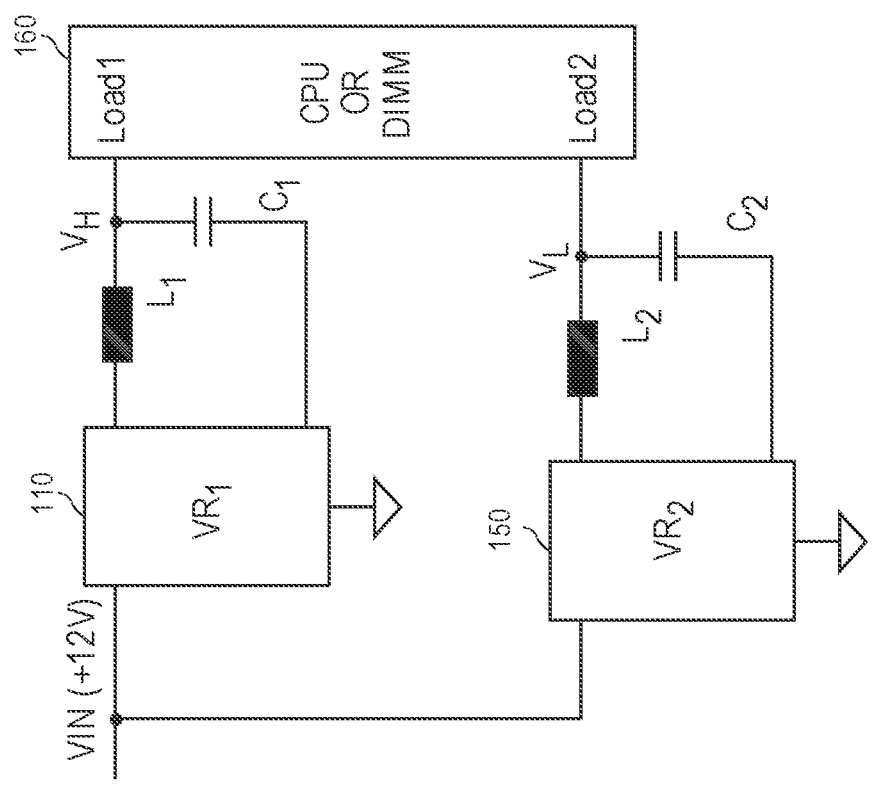
FIG. 1A shows a circuit to produce multiple voltage rails, without various improvements of the invention.

FIG. 1A shows a circuit to produce multiple voltage rails, without various improvements of the invention. In the illustrated circuit, a source voltage VIN powers two voltage regulators 110 and 150, which provide power to a device 160. NOTE: as used in this document, the term 'source voltage' refers to the common input voltage for the multiple voltage regulators. An example of the indicated source voltage is shown as +12V DC, but other values may be used. Only two voltage regulators are shown, with $VR_1$ being represented as outputting the higher voltage $V_H$, and $VR_2$ outputting the lower voltage $V_L$. Other numbers of voltage regulators may be used, but these two serve to illustrate one example.

In the illustrated embodiment, inductors $L_1$ and $L_2$ are shown at the output of voltage regulators $VR_1$ and $VR_2$, respectively, and may be used to smooth out ripples in those two outputs. Other embodiments may not have these inductors. Capacitors $C_1$ and $C_2$ are shown at the output of the inductors (or alternately at the outputs of the voltage regulators), and may be used to further smooth out voltages $V_H$ and $V_L$, and to provide charge storage capacity on those outputs. These voltages may then be provided to the loads. In this example, the loads are in a device 160, which is shown as a central processing unit (CPU) or dual in-line memory module (DIMM), but other devices may be used.

FIG. 1B shows a diagram of voltage rails after a loss of source power to the circuit of FIG. 1A. The diagram shows $V_H$ and $V_L$ at constant levels until time $t_1$, at which point source voltage VIN may be lost. This in turn may cause $V_H$ and $V_L$ to begin dropping as shown. In this particular example, $V_H$ may drop faster than $V_L$ until it drops lower than $V_L$ at time $t_2$ and beyond. This reverse-voltage condition may cause damage to sensitive circuit components in the load.

Figure 2A:
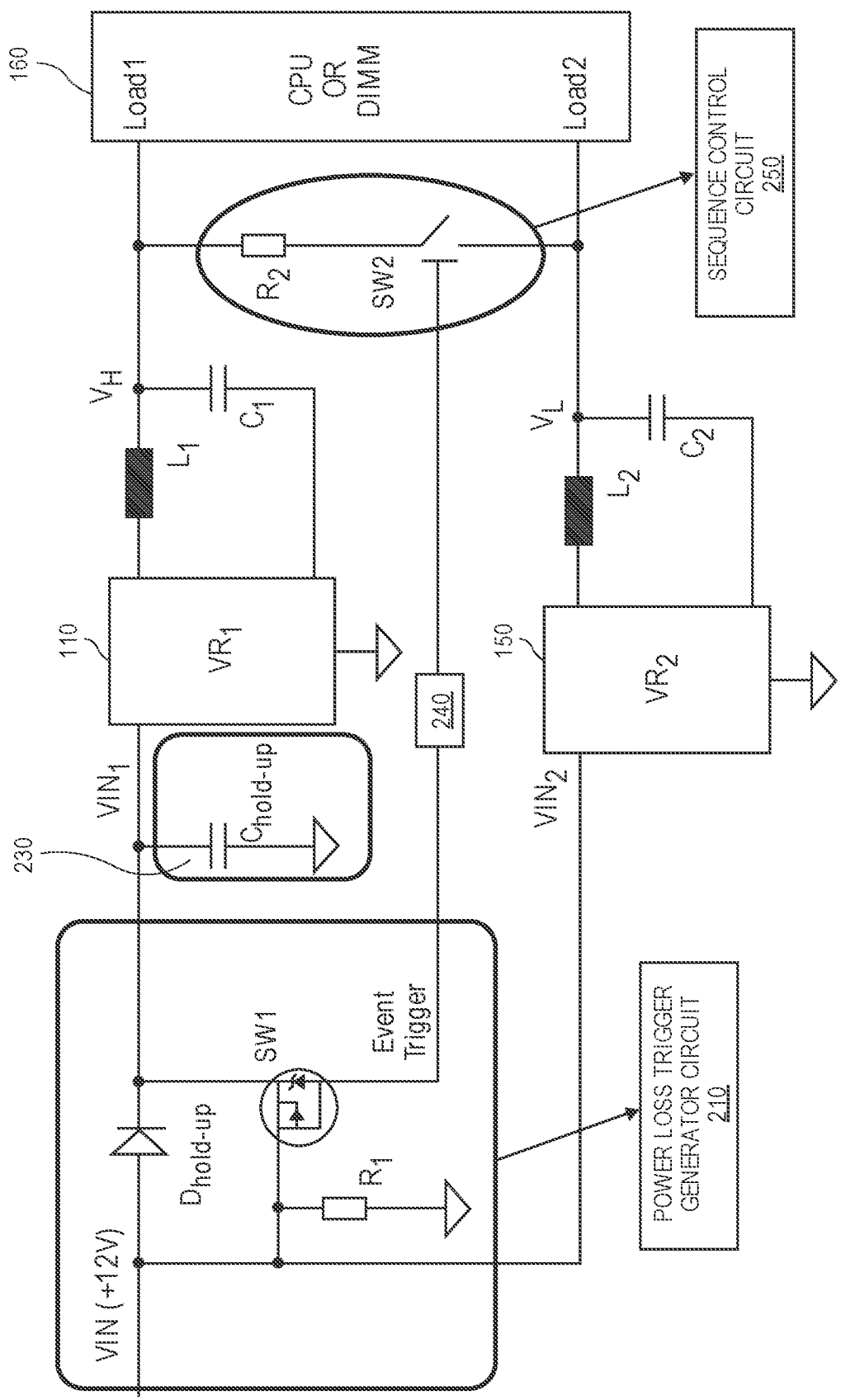
FIG. 2A shows a circuit to produce multiple voltage rails, with protective circuitry according to an embodiment of the invention.

FIG. 2A shows a circuit to produce multiple voltage rails, with protective circuitry according to an embodiment of the invention. The general components $VR_1$ and $VR_2$, $L_1$ and $L_2$, $C_1$, and $C_2$, and CPU or DIMM may be as shown in FIG. 1A. However, two additional circuits have been added. Power Loss Trigger Generator Circuit 210 may be used to detect a loss of source voltage VIN, and use that detection to generate an Event Trigger Signal. The event trigger signal in this case may be a signal to the Sequence Control Circuit 250 indicating that source voltage VIN has been lost, and this signal may then be used to activate the Sequence Control Circuit 250.

Although a loss of VIN may cause a loss of input power $VIN_1$ to $VR_1$ and $VIN_2$ to $VR_2$, two components may be added to cause $VIN_1$ and $VIN_2$ to react differently. Capacitor $C_{hold\text{-}up}$ may cause $VIN_1$ to drop more slowly than $VIN_2$. Without more, this might keep $V_H$ from dropping as quickly as it did in FIG. 1A. Without a comparable hold-up capacitor at the input of VR2, the amount of time it takes $V_H$ to drop below $V_L$ may be longer than in FIG. 1B. However, $V_H$ may still eventually drop below $V_L$, so the problem may be delayed but not prevented.

In addition to the capacitor $C_{hold-up}$, diode $D_{hold-up}$ may be used to keep $VIN_1$ from draining down into the input of $VR_2$, which could have indeterminate effects on the relationship of $V_H$ and $V_{IL}$. $D_{hold-up}$ and resistor $R_1$ may also be used to maintain the proper voltage relationships on switch SW1 so that once switch SW1 closes, it will stay closed as long as VIN is missing.

While the Power Loss Trigger Generator Circuit 210 may detect a loss of source voltage and generate a trigger signal in response, additional circuitry may be needed to prevent $V_H$ from dropping below $V_L$. This additional circuitry may be in the form of Sequence Control Circuit 250. In the illustrated embodiment, Sequence Control Circuit 250 is connected between high rail $V_H$ and low rail $V_L$. Sequence Control Circuit 250 may be as simple as a resistor $R_2$ in series with a switch $SW_2$, but some embodiments may use other components. For example, another embodiment may have a Schottky diode in series with the resistor.

In one embodiment, switch SW2 may be open during normal operation, but closed when it receives the Event Trigger signal. This may effectively couple the $V_H$ rail to the $V_L$ rail immediately, through resistor $R_2$. Resistor R2 may prevent two different voltages from being completely shorted together, but current may flow from $C_1$ to $C_2$ between the two rails through R2

Because of this current flow, eventually voltage $V_H$ and $V_L$ may reach a state of equilibrium and be at the same voltage level. At this point, the flow of current through R2 may stop, which effectively shorts $V_H$ to $V_L$. By shorting $V_H$ and $V_L$ together, $V_H$ is prevented from dropping below $V_L$, and a potentially damaging reverse voltage condition may be prevented. After $V_H$ and $V_L$ reach equilibrium, capacitors $C_1$ and $C_2$ may continue to drain together into their respective loads until there is no charge left in them.

Although the Event Trigger Signal may be connected directly to the gate of switch SW2, in some embodiments it may be coupled indirectly to SW2 through logic 240. Logic 240 may serve various purposes, such as delaying the Event Trigger Signal from reaching the Sequence Control Circuit too quickly. This delay might serve various purposes, such as but not limited to allowing a short glitch at VIN from starting the Sequence Control process if the power outage is too short for its effects to feed through the voltage regulators.

Figure 2B:
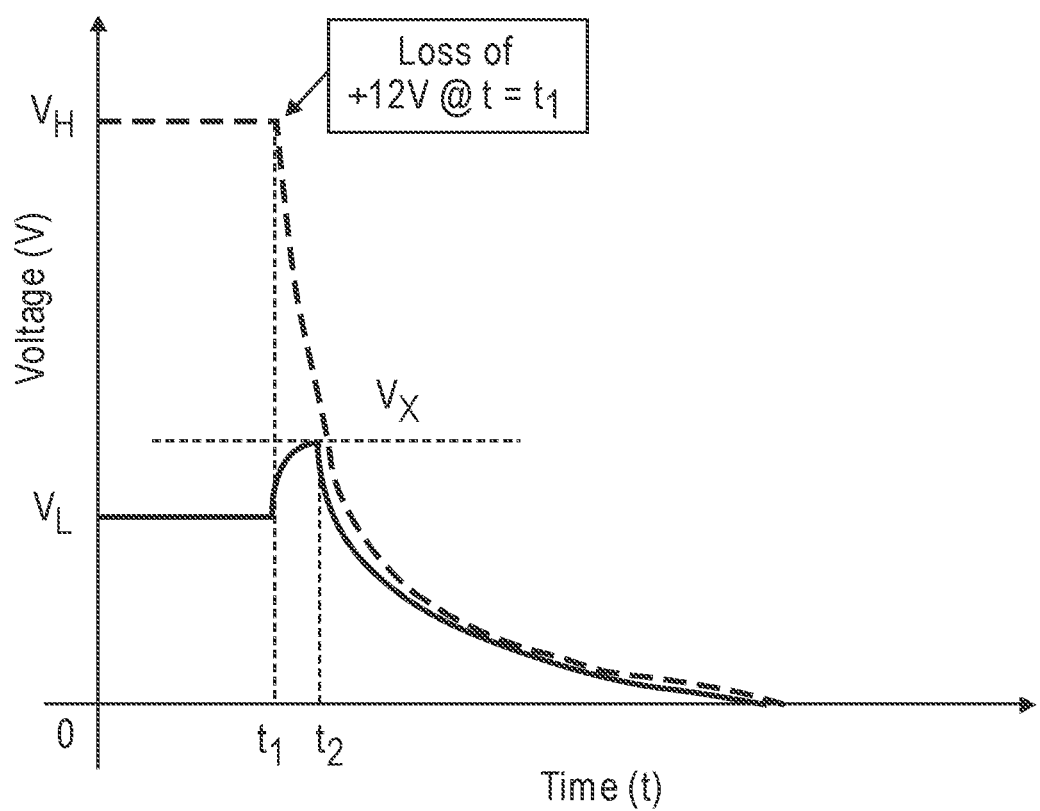
FIG. 2B shows a diagram of voltage rails after a loss of source power to the circuit of FIG. 2A, according to an embodiment of the invention.

FIG. 2B shows a diagram of voltage rails after a loss of source power to the circuit of FIG. 2A, according to an embodiment of the invention. The diagram shows $V_H$ and $V_L$ at constant levels until time $t_1$. Time $t_1$ may be the point at which switch SW2 in FIG. 2A closes, coupling rail $V_H$ to $V_L$ through resistor R2. Since $V_H$ and $V_L$ are now coupled together through R2, capacitors $C_1$ and $C_2$ may cause the higher voltage level $V_H$ to pull up the voltage level $V_L$ as shown until they reach equilibrium voltage level $V_X$ at time $t_2$. The time it takes to go from $t_1$ to $t_2$ may depend on the storage capacitance of $C_1$ and $C_2$, the resistance in resistor R2, and the loads placed on $V_H$ and $V_L$, respectively. R2 may be sized to make sure that $V_X$ does not exceed the maximum voltage of any circuitry powered by $V_L$ From time $t_2$ forward, $V_H$ and $V_L$ may continue to drop in unison until they reach zero volts. In this manner, $V_H$ is prevented from dropping below $V_L$ throughout the power-down process. Beyond $t_2$, with a voltage differential of zero volts, the circuitry of the load may essentially be in the same condition as it is when it has no voltage applied to it, so there should be no problem with damaging voltage differences or with having enough voltage to operate the circuitry in an unknown state.

Between $t_1$ and $t_2$, the difference between $V_H$ and $V_L$ may drop rapidly, causing the circuitry of the load to see a rapidly decreasing voltage at its power inputs. Since there will not be any reverse voltage condition at these inputs, there should not be any damaging voltage conditions.

Depending on the particular circuitry within the load, having a less-than-desirable voltage across the power inputs of the load might cause unpredictable logic operations within the load circuitry for the brief time of $t_1$ to $t_2$. Provided these operations do not cause any stored conditions that carry over through the power outage, this should not cause any problems, since the subsequent power-up may reset all startup conditions in their desired states.

Figure 3:
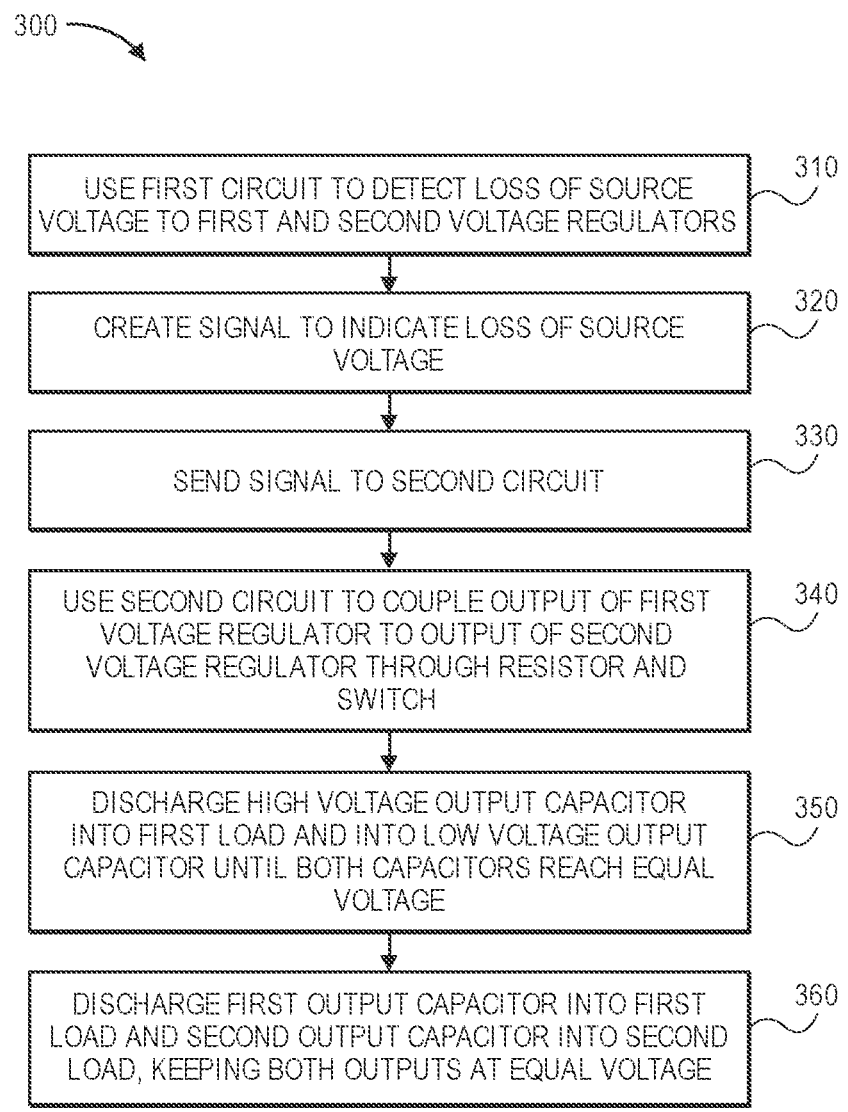
FIG. 3 shows a flow diagram of a method of operations in the circuitry of FIG. 2A, according to an embodiment of the invention.

FIG. 3 shows a flow diagram of a method of operations in the circuitry of FIG. 2A. In flow diagram 300, at 310 a first circuit may detect a loss of the source voltage that is converted to multiple voltage rails through multiple voltage regulators. At 320 the first circuit may output a signal indicating the source voltage has been lost. At 330 this signal may be sent to a second circuit. In some embodiments the signal may be sent directly. In other embodiments the signal may go through other components before it reaches the second circuit.

At 340 the second circuit may close a switch to connect the first voltage rail to the second voltage rail through a resistor. Due to the resistor connection, at 350 a capacitor connected to the higher voltage rail may discharge into the higher voltage load and may also discharge into a capacitor on the lower voltage rail until both capacitors have the same voltage. At 360, both capacitors may discharge into their respective loads, with their respective voltages remaining equal. When both capacitors are fully discharged, power-down of the voltage rails may be complete.

Figure 4:
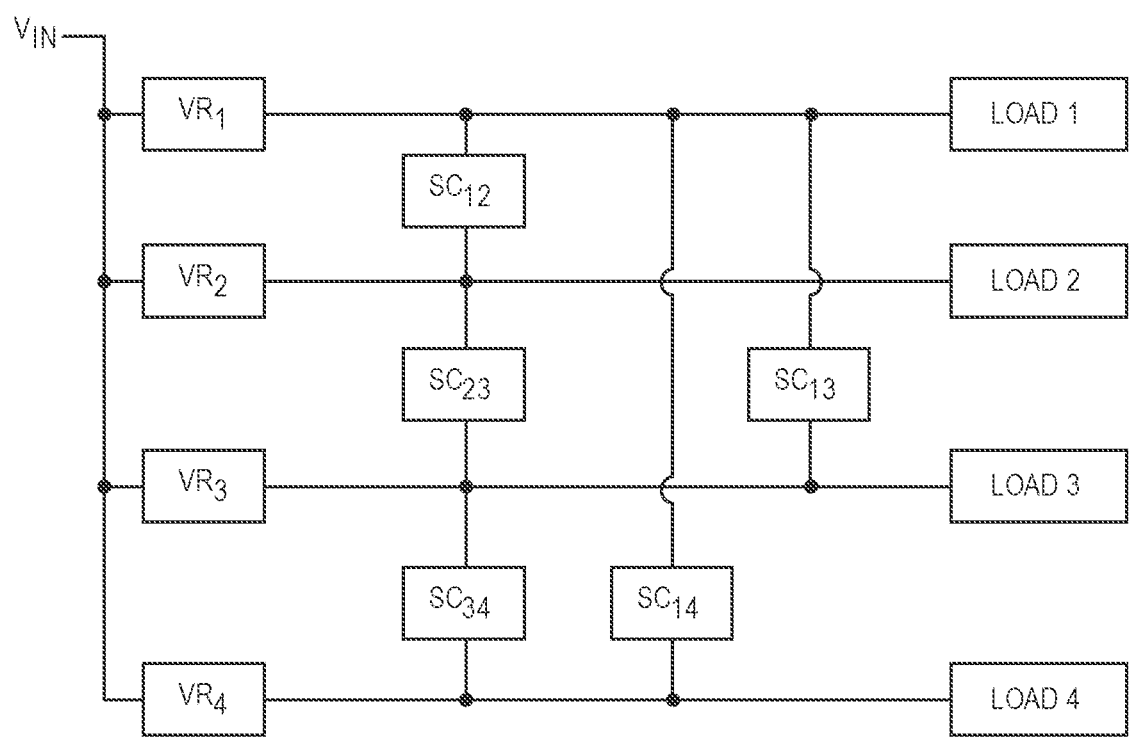
FIG. 4 show an implementation that extends the same basic principles to more VRs, according to an embodiment of the invention.

So far, the various embodiments have been described in terms of two VRs producing two output voltages. However, the same principles may be applied with more than two. FIG. 4 show an implementation that extends the same basic principles to more VRs. In this embodiment, VIN may provide a source voltage for four VRs, labeled $VR_1$, $VR_2$, $VR_3$, and $VR_4$, which provide four different voltages to Load 1, Load 2, Load 3, and Load 4, respectively. In the illustrated embodiment, it is assumed that the output voltage from $VR_1$ is greater than the output voltage from $VR_2$, which is greater than the output voltage of $VR_3$, which is greater than the output voltage of $VR_4$. However, other configurations may also be used.

The various Sequence Control circuits (see FIG. 2A) are indicated as $SC_{XY}$, where x and y indicate the two VRs whose outputs are connected by that particular Sequence Control circuit. The specific outputs that are to be connected in this way may depend on the relative needs of the various loads.

EXAMPLES

The following examples pertain to particular embodiments:

Example 1 includes a multiple-voltage producing circuit to produce multiple voltage rails, comprising: a first voltage regulator to convert an input voltage to a first output voltage at a first output; a second voltage regulator to convert the input voltage to a second output voltage at a second output, wherein the second output voltage is to be less than the first output voltage prior to a first time; a detection circuit to detect a loss of the input voltage and to generate a signal in response to said loss at the first time; and a sequence control circuit connected between the first output and the second output; wherein the sequence control circuit includes a switch to connect the first output to the second output through a resistor, resultant to said signal.

Example 2 includes the multiple-voltage producing circuit of example 1, wherein the sequence control circuit includes a Schottky diode in series with the resistor.

Example 3 includes the multiple-voltage producing circuit of example 2, wherein the signal is to close the switch when the input voltage is lost.

Example 4 includes the multiple-voltage producing circuit of example 3, further comprising a first capacitor connected to the first output and a second capacitor connected to the second output.

Example 5 includes the multiple-voltage producing circuit of example 4, wherein upon receipt of the signal by the sequence control circuit, the switch is to be closed at a first time to maintain the first output voltage greater than or equal to the second output voltage until a second time.

Example 6 includes the multiple-voltage producing circuit of example 5, wherein the first capacitor is to discharge into the second capacitor between the first time and the second time, and the first capacitor is to discharge into a first load and the second capacitor is to discharge into a second load subsequent to the second time.

Example 7 includes the multiple-voltage producing circuit of example 1, wherein the detection circuit includes a diode connected between an input of the first voltage regulator and an input of the second voltage regulator.

Example 8 includes a system comprising: an electronic device having first and second load inputs; first and second voltage regulators having inputs to be connected to a common input voltage, the first voltage regulator having a first output coupled to the first load input and the second voltage regulator having a second output coupled to the second load input; a first circuit to detect a loss of the input voltage and to generate a signal in response to said detection; and a second circuit connected between the first and second outputs; wherein the second circuit includes a switch and a resistor in series, the switch to connect the first output to the second output through the resistor resultant to said detection.

Example 9 includes the system of example 8, wherein the signal is to close the switch resultant to said detection.

Example 10 includes the system of example 8, wherein the signal is to close the switch when the common input voltage is lost.

Example 11 includes the system of example 8, further comprising a first capacitor connected to the first output and a second capacitor connected to the second output.

Example 12 includes the system of example 11, configured such that the first capacitor is to discharge into the second capacitor when the switch is closed at a first time until a first voltage at the first output is equal to or greater than a second voltage at the second output at a second time.

Example 13 includes the system of example 12, configured such that a voltage on the first capacitor and a voltage on the second capacitor are to have equal voltages subsequent to the second time.

Example 14 includes a method of operating a circuit to produce first and second voltage rails, comprising: using a first circuit to detect a loss of source voltage to first and second voltage regulators; creating a signal in response to said detection; sending the signal to a second circuit; connecting an output of the first voltage regulator to an output of the second voltage regulator at a first time in response to receiving the signal by the second circuit; wherein said connecting comprises connecting through a resistor and a switch.

Example 15 includes the method of example 14, wherein said connecting comprises discharging a first capacitor at the output of the first voltage regulator into a second capacitor at the output of the second voltage regulator until the first output voltage equals the second output voltage at a second time.

Example 16 includes the method of example 15, further comprising maintaining equal voltages at the first and second capacitors subsequent to the second time.

Example 17 includes the method of example 16, further comprising discharging the first capacitor into a first load and discharging into the second capacitor into a second load, subsequent to the second time.

The foregoing description is intended to be illustrative and not limiting. Variations will occur to those of skill in the art. Those variations are intended to be included in the various embodiments of the invention, which are limited only by the scope of the following claims.

What is claimed is:

1. A multiple-voltage producing circuit to produce multiple voltage rails, comprising:
   a first voltage regulator to convert an input voltage to a first output voltage at a first output;
   a first capacitor connected to the first output;
   a second voltage regulator to convert the input voltage to a second output voltage at a second output, wherein the second output voltage is to be less than the first output voltage prior to a first time;
   a second capacitor connected to the second output;
   a detection circuit to detect a loss of the input voltage and to generate a signal in response to said loss at the first time; and
   a sequence control circuit connected between the first output and the second output;
   wherein the sequence control circuit includes a switch to connect the first output to the second output through a resistor, resultant to said signal, and the first capacitor is to discharge through the resistor into the second capacitor after the first time.

2. The multiple-voltage producing circuit of claim 1, wherein the sequence control circuit includes a Schottky diode in series with the resistor.

3. The multiple-voltage producing circuit of claim 1, wherein the signal is to close the switch when the input voltage is lost.

4. The multiple-voltage producing circuit of claim 3, wherein, upon receipt of the signal by the sequence control circuit, the switch is to be closed at the first time to maintain the first output voltage greater than or equal to the second output voltage until a second time.

5. The multiple-voltage producing circuit of claim 4, wherein the first capacitor is to discharge into a first load and the second capacitor is to discharge into a second load subsequent to the second time.

6. The multiple-voltage producing circuit of claim 1, wherein the detection circuit includes a diode connected between an input of the first voltage regulator and an input of the second voltage regulator.

7. The multiple-voltage producing circuit of claim 1, further comprising:
   logic to delay the signal, the logic connected between the detection circuit and the switch.

8. A system, comprising:
   an electronic device having first and second load inputs;
   first and second voltage regulators having inputs to be connected to a common input voltage, the first voltage regulator having a first output coupled to the first load input, and the second voltage regulator having a second output coupled to the second load input;
a first capacitor connected to the first output;
a second capacitor connected to the second output;
a first circuit to detect a loss of the common input voltage and to generate a signal in response to said detection; and
a second circuit connected between the first and second outputs;
wherein the second circuit includes a switch and a resistor in series, the switch to connect the first output to the second output through the resistor resultant to said detection, and the first capacitor is to discharge through the resistor into the second capacitor when the switch is closed.

9. The system of claim 7, wherein the signal is to close the switch resultant to said detection.

10. The system of claim 7, wherein the signal is to close the switch when the common input voltage is lost.

11. The system of claim 8, configured such that the first capacitor is to discharge into the second capacitor when the switch is closed at a first time until a first voltage at the first output is equal to or greater than a second voltage at the second output at a second time.

12. The system of claim 11, configured such that a voltage on the first capacitor and a voltage on the second capacitor are to have equal voltages subsequent to the second time.

13. The system of claim 8, further comprising:
a third capacitor having a first end connected to the input of the first voltage regulator and a second end connected to a rail.

14. A method of operating a circuit to produce first and second voltage rails, comprising:
using a first circuit to detect a loss of source voltage to first and second voltage regulators;
creating a signal in response to said detection;
sending the signal to a second circuit; and
connecting a first output of the first voltage regulator to a second output of the second voltage regulator at a first time in response to receiving the signal by the second circuit;
wherein said connecting comprises
connecting through a resistor and a switch, and
discharging a first capacitor at the first output of the first voltage regulator through the resistor into a second capacitor at the second output of the second voltage regulator.

15. The method of claim 14, wherein said discharging is performed until a voltage of the first output equals a voltage at the second output at a second time.

16. The method of claim 15, further comprising:
maintaining equal voltages at the first and second capacitors subsequent to the second time.

17. The method of claim 16, further comprising:
discharging the first capacitor into a first load and discharging the second capacitor into a second load, subsequent to the second time.

18. The system of claim 13, further comprising:
a diode having an input that receives the common input voltage and an output connected to the first end of the third capacitor.

19. The system of claim 18, further comprising:
a resistor having one end that receives the common input voltage and another end connected to a rail.

20. The method of claim 14, further comprising:
keeping the source voltage from draining into an input of the second voltage regulator, using a diode, the diode having an input that receives the source voltage and an output connected to an input of the first voltage regulator.

* * * * *

UNITED STATES PATENT AND TRADEMARK OFFICE
CERTIFICATE OF CORRECTION

PATENT NO. : 10,908,665 B2
APPLICATION NO. : 16/225047
DATED : February 2, 2021
INVENTOR(S) : Horthense Delphine Tamdem et al.

Page 1 of 1

It is certified that error appears in the above-identified patent and that said Letters Patent is hereby corrected as shown below:

In the Claims

In Column 7, Line 16, in Claim 9, delete "claim 7" and insert -- claim 8 --, therefor.

In Column 7, Line 18, in Claim 10, delete "claim 7" and insert -- claim 8 --, therefor.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*